(12) United States Patent
Petit et al.

(10) Patent No.: US 6,528,407 B1
(45) Date of Patent: Mar. 4, 2003

(54) PROCESS FOR PRODUCING ELECTRICAL-CONNECTIONS ON A SEMICONDUCTOR PACKAGE, AND SEMICONDUCTOR PACKAGE

(75) Inventors: Luc Petit, Fontaine (FR); Alexandre Castellane, Colombe (FR)

(73) Assignee: STMicroelectronics S.A., Gentilly (FR)

( * ) Notice: Subject to any disclaimer, the term of this patent is extended or adjusted under 35 U.S.C. 154(b) by 11 days.

(21) Appl. No.: 09/684,410

(22) Filed: Oct. 6, 2000

(30) Foreign Application Priority Data

Oct. 8, 1999 (FR) .............................. 99 12545

(51) Int. Cl.[7] .............................................. H01L 21/44
(52) U.S. Cl. ..................... 438/613; 438/612; 438/106; 438/25; 438/26; 438/64; 257/678
(58) Field of Search ................. 438/613, 612, 438/106–109, 25–26, 64; 257/678

(56) References Cited

U.S. PATENT DOCUMENTS

| 5,331,172 A | * | 7/1994 | Kumar et al. ........... 250/492.21 |
| 5,851,337 A | * | 12/1998 | Chen ........................ 156/275.3 |
| 5,962,921 A | * | 10/1999 | Farnworth et al. ............ 257/773 |
| 6,002,172 A | * | 12/1999 | Desai et al. ................ 257/737 |
| 6,300,164 B1 | * | 4/2000 | Call et al. .................... 438/108 |
| 6,077,726 A | * | 6/2000 | Mistry et al. ............... 438/108 |
| 6,397,460 B1 | * | 8/2000 | Hembree ....................... 29/832 |
| 6,118,180 A | * | 9/2000 | Loo et al. .................... 257/737 |
| 6,165,885 A | * | 12/2000 | Gaynes et al. ............... 438/612 |
| 6,232,243 B1 | * | 5/2001 | Farnworth et al. ........... 438/763 |
| 6,242,932 B1 | * | 6/2001 | Hembree ..................... 324/755 |
| 6,251,766 B1 | * | 6/2001 | Desai et al. ................. 438/614 |
| 6,294,837 B1 | * | 9/2001 | Akram et al. ................ 257/774 |
| 6,329,605 B1 | * | 11/2001 | Beroz et al. ................. 174/256 |
| 6,324,754 B1 | * | 12/2001 | DiStefano et al. ............ 29/840 |
| 6,337,445 B1 | * | 1/2002 | Abbott et al. ............... 174/260 |
| 2001/0002068 A1 | * | 5/2001 | Farnworth et al. ........... 257/737 |

FOREIGN PATENT DOCUMENTS

| EP | 0 690 504 A1 | | 1/1996 | |
| EP | 1-091-627 | * | 3/2000 | ............ H05K/3/34 |
| JP | 63-232354 | | 9/1988 | |
| JP | 3-75394 | | 3/1991 | |
| WO | WO 97/45871 | | 12/1997 | |

OTHER PUBLICATIONS

Preliminary Search Report dated Jun. 22, 2000 for French Patent Application No. 99 12545.

* cited by examiner

*Primary Examiner*—Matthew S. Smith
*Assistant Examiner*—Granvill D Lee, Jr.
(74) *Attorney, Agent, or Firm*—Lisa K. Jorgenson; Jon A. Gibbons; Fleit, Kain, Gibbons, Gutman & Bongini P.L.

(57) ABSTRACT

Process for producing electrical-connections on a semiconductor package containing an integrated-circuit chip and with an external protective layer having apertures that least partly expose metal electrical-connection regions, and semiconductor package provided with such metal electrical-connections. The apertures having walls are filled with a metal electrical-connection layer covering at least their walls. A metal solder drop is soldered to the connection layer so that it is not in contact with the external protective layer.

21 Claims, 2 Drawing Sheets

PROCESS FOR PRODUCING ELECTRICAL-CONNECTIONS ON A SEMICONDUCTOR PACKAGE, AND SEMICONDUCTOR PACKAGE

CROSS-REFERENCE TO RELATED APPLICATIONS

This application is based upon and claims priority from prior French Patent Application No. 99-12545, filed Oct. 8, 1999, the entire disclosure of which is herein incorporated by reference.

BACKGROUND OF THE INVENTION

1. Field of the Invention

The present invention relates to the field of semiconductor packages containing an integrated-circuit chip and more particularly to the field of the production of electrical-connections on semiconductor packages using solder drops or solder balls.

2. Description of Related Art

Present techniques for semiconductor packages comprise an external protective layer made of an organic material constituting a mask, in which layer a multiplicity of apertures are made so as to expose metallic electrical-connection regions or pads, generally made of copper, connected to the chip.

In a first known technique for semiconductor packages, these electrical-connection regions are completely exposed. They are covered with an anti-diffusion first metal layer, generally made of nickel, with an anti-oxidation second metal layer, generally made of gold, and with a metal solder drop or solder ball, generally made of a tin-based alloy, this drop not reaching the wall of the apertures. This first technique, although useful, is not without its shortcoming. One shortcoming is the weakness of the metal connection regions which may become detached from the package.

In a second known technique for semiconductor packages, the electrical-connection regions are exposed only in their central part. The electrical-connection regions are covered, as far as the wall of the apertures, with an anti-diffusion first metal layer, with an anti-oxidation second layer and then with a metal solder drop, this drop filling the aperture and extending well beyond it. This second technique although useful is not without its shortcomings. One shortcoming is a discontinuity in the surface of the metal solder drop is produced along the edge of the aperture because of the fact that the solder drop has a tendency to extend over the external surface of the external protective layer, around the aperture, so that internal cracks frequently appear, which weaken the solder drop.

Accordingly, a need exists to overcome the above mentioned shortcomings with the prior art and to provide a process for producing electrical-connections on a semiconductor package to minimize detachment from the semiconductor package and to improve the strength of the solder drop.

SUMMARY OF THE INVENTION

The present invention improves the strength of the electrical-connections of a semiconductor package with solder drops or solder balls.

The subject of the present invention is a process for producing electrical-connections on a semiconductor package containing an integrated-circuit chip and having an external protective layer having apertures at least partly exposing metal electrical-connection regions.

According to the invention, this process consists in filling the apertures with a metal electrical-connection layer due to the effect of a supply of electric current in the central part of the aperture via a tip, in such a way that the metal layer covers at least the wall of the aperture, and in soldering a metal solder drop to the metal electrical-connection layer in such a way that this solder drop is at least partly not in contact with the external protective layer.

According to the invention, the process preferably consists in depositing an anti-oxidation metal layer on the metal electrical-connection layer and in soldering the metal solder drop to the anti-oxidation metal layer. The subject of the invention is also a semiconductor package containing an integrated-circuit chip.

According to the invention, this package comprises an external protective layer having apertures at least partly exposing metal electrical-connection regions. The apertures are filled with a metal electrical-connection layer covering at least their wall. Furthermore, a metal solder drop is soldered to the connection layer and at least part of the solder drop is not in contact with the external protective layer.

According to the invention, the central part of the electrical-connection layer is preferably recessed and the thickness of the peripheral part of the layer is preferably engaged beneath the external protective layer.

According to the invention, the walls of the apertures of the external protective layer are preferably divergent.

According to the invention, the peripheral part of the metal electrical-connections regions is preferably engaged beneath the external protective layer.

According to the invention, the metal electrical-connection regions may advantageously comprise branches engaged beneath the external protective layer.

BRIEF DESCRIPTION OF THE DRAWINGS

The present invention will now be illustrated by an embodiment of electrical-connections on a semiconductor package using solder drops or solder balls, the example being described with reference to the drawing in which.

DETAILED DESCRIPTION OF PREFERRED EMBODIMENTS

Figure 1:
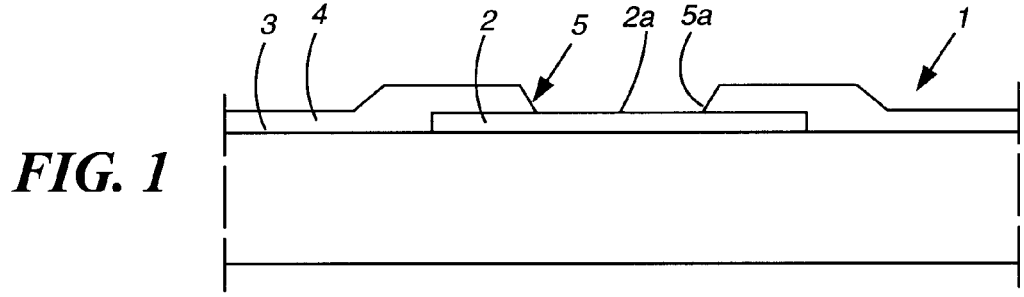
FIG. 1 shows a partial cross section through a semiconductor package having no external electrical-connection.

It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

Referring now to FIG. 1, shown is a semiconductor package 1 which comprises a multiplicity of metal regions or pads 2, generally made of copper, which are produced on its surface 3. This surface 3 is covered with an external protective layer or mask 4 made of an organic material, in which a multiplicity of apertures 5 are produced. The apertures make it possible to expose the central part 2a of each region 2. The peripheral part of these regions 2 remaining engaged beneath the external protective layer 4.

In this example shown, the wall 5a of the apertures 5 is in the form of a truncated cone open to the outside so as to diverge outwardly.

Figure 2:
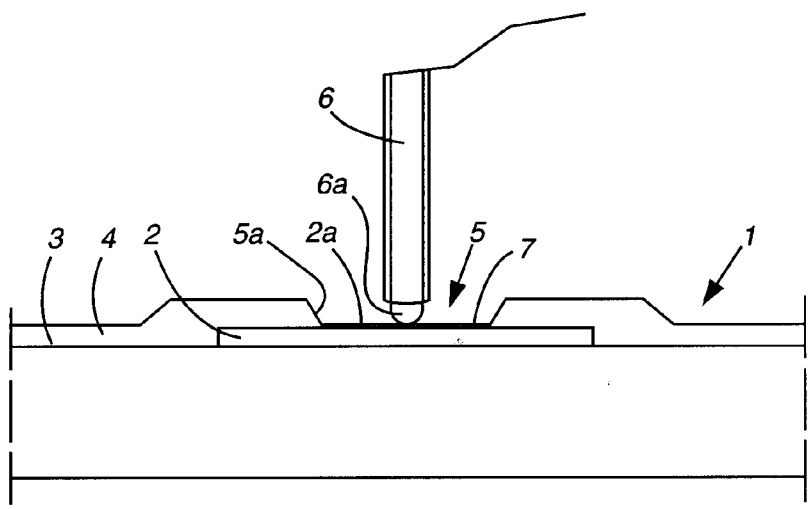
FIG. 2 shows an operation of depositing an anti-diffusion metal layer on the semiconductor package of FIG. 1.

FIG. 2 shows an operation of depositing an anti-diffusion metal layer on the semiconductor package of FIG. 1. Referring to FIG. 2, shown is positioned in each of the apertures 5, a tip 6 for supplying electric current, in such a way that the tip extends perpendicular to the surface 3. The tip 6 has a free end 6a positioned into the middle of the central part 2a of the metal connection regions 2, the electric current being taken up by the other face (not shown) of the semiconductor package 1. A metal layer 7, generally made of nickel, is then deposited catalytically or electrolytically, in a manner known to those of average skill in the art, on the central part 2a of the metal connection regions 2, as far as the wall 5a of the apertures 5.

Figure 3:
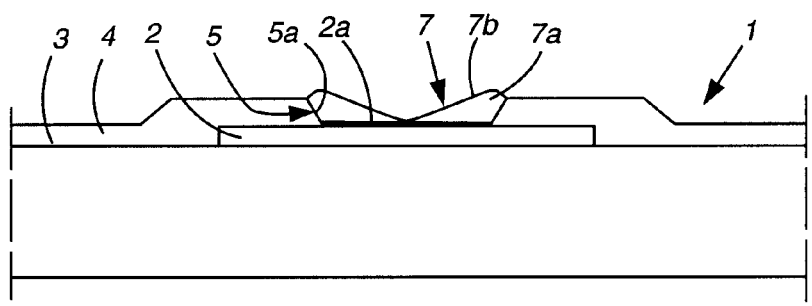
FIG. 3 shows the semiconductor package after the deposition operation illustrated in FIG. 2.

FIG. 3 shows the semiconductor package after the deposition operation illustrated in FIG. 2. Referring to FIG. 3, at the end of the deposition operation of FIG. 2, shown is the metal layer 7 extending over the entire surface of the central part 2a of the metal regions 2 and that the peripheral part 7a of the metal layer 7 completely fills the peripheral part of the apertures 5 and is thicker than the external protective layer 4, in such away that it projects outwards, and that the central part 7b of the metal layer 7 is recessed.

Next, and in a manner known to those of average skill in the art (not shown), an anti-oxidation layer, generally made of gold, is deposited on each anti-diffusion metal layer 7 thus obtained.

Figure 4:
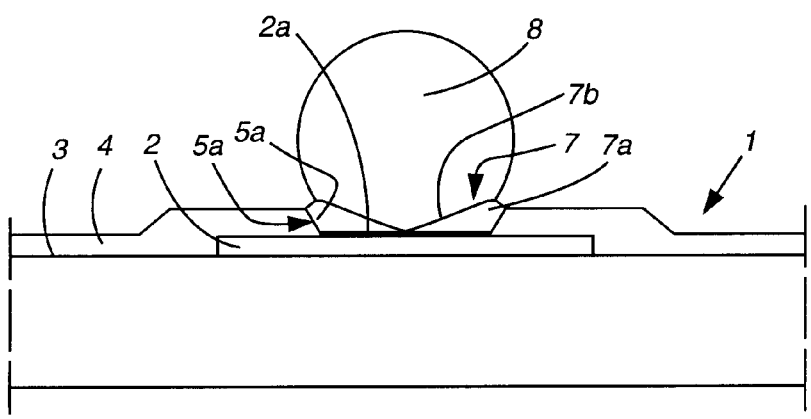
FIG. 4 shows the package after a solder drop has been deposited on the semiconductor package of FIG. 3.

Referring to FIG. 4, shown is a solder drop or solder ball 8, generally made of a tin-based alloy, deposited on each anti-oxidation layer, which disappears by diffusion into the drop 8, in such a way that this solder drop 8 is soldered to the metal layer 7. The solder drop 8 is centered on the metal layer 7 and covers it close to its periphery, without however coming into contact with the external protective layer 4.

Thus, there is no discontinuity, neither at the surface of the solder drop 8 nor at the periphery of the interface between the solder drop 8 and the metal layer 7, so that the connections particularly strong.

In an alternative embodiment, the metal layer 7 could be deposited in such a way that its surface lies outside the surface of the external protective layer 4 and is approximately flat.

Figure 5:
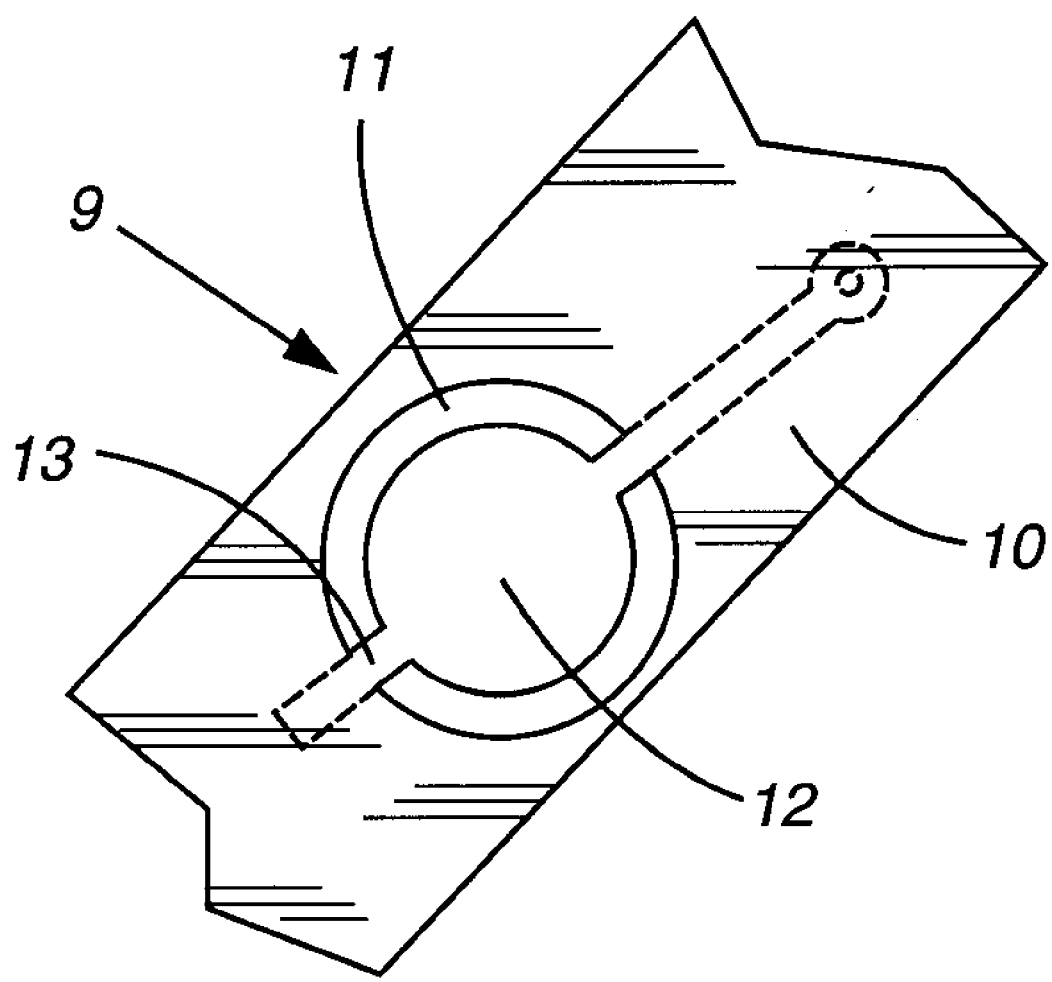
FIG. 5 shows an alternative embodiment of the semiconductor package of FIG. 1 with metal pads having radial branches.

FIG. 5 shows an alternative embodiment of the semiconductor package of FIG. 1 with metal pads having radial branches. Referring to FIG. 5, shown is a package 9 whose the external protective layer 10 has apertures 11 completely exposing metal electrical-connection regions 12. The peripheries metal electrical-connection regions 12 extending close to the wall of the apertures 11. In this alternative embodiment, the metal regions or pads 12 furthermore comprise radial branches 13, the ends of which extend beneath the external protective layer 10. Thus, it is more difficult for the metal regions 12 to be torn off.

While the invention has been illustrated and described in the preferred embodiments, many modifications and changes therein may be affected by those skilled in the art. It is to be understood that the invention is not limited to the precise construction herein disclosed. Accordingly, the right is reserved to all changes and modification coming within the true spirit and scope of the invention.

What is claimed is:

1. A process for producing electrical-connections on a semiconductor package with an integrated-circuit having one or more metal electrical-connections, the process comprsing the steps of:

forming an external protective layer over one or more regions of metal electrical-connections on a semiconductor package, the external protective layer having one or more apertures formed therein with walls, the apertures at least partly exposing the one or more regions of metal electrical-connections:

filling the apertures with a metal electrical-connection layer by supplying an electric current through a tip placed in a central part of the aperture, so that the metal electrical-connection layer covers at least the walls of the aperture and forms the metal electrical-connection layer with a recessed central part and a peripheral part which is thicker on a periphery of the aperture than in the central part of the aperture; and soldering a metal solder drop to the metal electrical-connection layer in such a way that the metal solder drop is not in contact with the external protective layer and the metal solder drop is automatically centered by the recessed central part of the metal electrical-connection layer.

2. The process according to claim 1, wherein the step of forming an external protective layer includes forming an external protective layer covering a peripheral part of the one or more regions of metal electrical-connections.

3. The process according to claim 1, further comprising the step of:

depositing an anti-oxidation metal layer on the metal electrical-connection layer and wherein the step of soldering includes soldering the metal solder drop to the anti-oxidation metal layer.

4. The process according to claim 1, wherein the step of placing an external protective layer includes placing an external protective layer over the one or more regions of metal electrical-connections on a semiconductor package, the external protective layer having one or more apertures formed therein with walls shaped in the form of a truncated cone diverging outwardly from the semiconductor package, the apertures at least partly exposing the one or more regions of metal electrical-connections.

5. The process according to claim 1, wherein the step of filling includes filling the apertures with a metal electrical-connection layer made of nickel.

6. The process according to claim 1, wherein the step of filling includes filling the apertures with a metal electrical-connection layer so that the metal electrical-connection layer covers the surface of the central part of the aperture and that the metal electrical-connection layer has a peripheral part formed by filling the walls of the one or more apertures.

7. The process according to claim 6, wherein the step of filling includes filling the apertures with a metal electrical-connection layer so that the peripheral part of the electrical-connection layer projects outward away from the semiconductor package with the portion of the metal electrical-connection layer over the central part being recessed as compared with the peripheral part of the electrical-connection layer.

8. The process according to claim 7, wherein the step of filling includes filling the apertures with a metal electrical-connection layer using at least one of catalytical and electrolytical deposit.

9. The process according to claim 7, wherein the step of soldering includes soldering a metal solder drop to a center of the metal electrical-connection layer so that the metal solder drop covers the peripheral part of each metal electrical-connection layer without coming into contact with the external protective layer, whereby there is no surface discontinuity between the metal solder drop and the metal connection layer.

10. The process according to claim 9, further comprising the step of:

depositing an anti-oxidation metal layer on the metal electrical-connection layer and wherein the step of soldering includes soldering the metal solder drop to the anti-oxidation metal layer so that the anti-oxidation metal layer is diffused into the metal solder drop.

11. A semiconductor package containing an integrated-circuit chip comprising:

one or more electrical-connections coupled to an integrated-circuit as part of a semiconductor package;

an external protective layer formed over one or more regions of the electrical-connections on the semiconductor package, the external protective layer having one or more apertures formed therein with walls, the apertures at least partly exposing the one or more regions of the metal electrical-connections;

a metal electrical-connection layer filling the apertures by supplying an electric current through a tip placed in a central part of the aperture, so that the metal electrical-connection layer covers at least the walls of the aperture and forms the metal electrical-connection layer with a recessed central part and a peripheral part which is thicker on a periphery of the aperture than in the central part of the aperture; and a metal solder drop soldered to the metal electrical-connection layer in such a way that the metal solder drop is not in contact with the external protective layer and the metal solder drop is automatically centered by the recessed central part of the metal electrical-connection layer.

12. The semiconductor package according to claim 11, wherein the external protective layer is formed covering a peripheral part of the one or more regions of the metal electrical-connections.

13. The semiconductor package according to claim 11, further comprising:

an anti-oxidation metal layer deposited on the metal electrical-connection layer and wherein the metal solder drop is soldered to the anti-oxidation metal layer.

14. The semiconductor package according to claim 11, wherein the external protective layer is formed over the one or more regions of the metal electrical-connections on a semiconductor package, the external protective layer having one or more apertures formed therein with walls shaped in the form of a truncated cone diverging outwardly from the semiconductor package, the apertures at least partly exposing the one or more regions of the metal electrical-connections.

15. The semiconductor package according to claim 11, wherein the metal electrical-connection layer is made of nickel.

16. The semiconductor package according to claim 11, wherein the metal electrical-connection layer covers the surface of the central part of the aperture and that the metal electrical-connection layer has a peripheral part formed by filling the walls of the one or more apertures.

17. The semiconductor package according to claim 16, wherein the metal electrical-connection layer fills the apertures so that the peripheral part of the electrical-connection layer projects outward away from the semiconductor package with the portion of the metal electrical-connection layer over the central part being recessed as compared with the peripheral part of the electrical-connection layer.

18. The semiconductor package according to claim 17, wherein the step of filling includes filling the apertures with a metal electrical-connection layer using at least one of catalytical and electrolytical deposit.

19. The semiconductor package according to claim 17, wherein the metal solder drop is soldered to a center of the metal electrical-connection layer so that the metal solder drop covers the peripheral part of each metal electrical-connection layer without coming into contact with the external protective layer, whereby there is no surface discontinuity between the metal solder drop and the metal connection layer.

20. The semiconductor package according to claim 19, further comprising:

an anti-oxidation metal layer deposited on the metal electrical-connection layer and wherein the metal solder drop is soldered to the anti-oxidation metal layer so that the anti-oxidation metal layer is diffused into the metal solder drop.

21. The semiconductor package according to claim 11 wherein the metal electrical-connection regions comprise branches beneath the external protective layer.

* * * * *